(12) United States Patent
Yamamoto

(10) Patent No.: US 8,251,635 B2
(45) Date of Patent: Aug. 28, 2012

(54) APPARATUS AND METHOD FOR SUPPLYING ARTICLES TO PROCESSING TOOL

(75) Inventor: Makoto Yamamoto, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 471 days.

(21) Appl. No.: 12/013,591

(22) Filed: Jan. 14, 2008

(65) Prior Publication Data

US 2008/0170932 A1    Jul. 17, 2008

(30) Foreign Application Priority Data

Jan. 12, 2007    (JP) ................. 2007-004462

(51) Int. Cl.
*B65H 5/00*   (2006.01)
(52) U.S. Cl. .................. 414/810; 414/222.01
(58) Field of Classification Search .......... 414/411, 414/626, 941, 222.01, 800, 810
See application file for complete search history.

(56) References Cited

U.S. PATENT DOCUMENTS

| | | | |
|---|---|---|---|
| 6,283,692 B1 * | 9/2001 | Perlov et al. | 414/222.01 |
| 6,672,820 B1 * | 1/2004 | Hanson et al. | 414/222.06 |
| 2006/0008342 A1 * | 1/2006 | Putzi | 414/222.01 |

FOREIGN PATENT DOCUMENTS

| | | |
|---|---|---|
| JP | 2004-023032 A | 1/2004 |
| JP | 2004168483 A | 6/2004 |
| JP | 2004281580 A | 10/2004 |

OTHER PUBLICATIONS

Japanese Office Action dated Aug. 4, 2008, issued in corresponding Japanese Patent Application No. 2007-004462.

* cited by examiner

*Primary Examiner* — Donald Underwood
(74) *Attorney, Agent, or Firm* — Westerman, Hattori, Daniels & Adrian, LLP

(57) ABSTRACT

An article supply apparatus includes a container storage rack for storing containers, and an article storage rack for storing articles taken out of the container. The article supply apparatus includes a transfer apparatus for transporting the articles between the container of the container storage rack and the article storage rack. The article supply apparatus includes a transportation apparatus for transporting the container between the transfer apparatus and the container storage rack, and a supply apparatus for taking required articles out of the article storage rack, and supplying the articles to a processing tool and supply the articles from the processing tool to the article storage rack.

1 Claim, 2 Drawing Sheets

F I G. 3
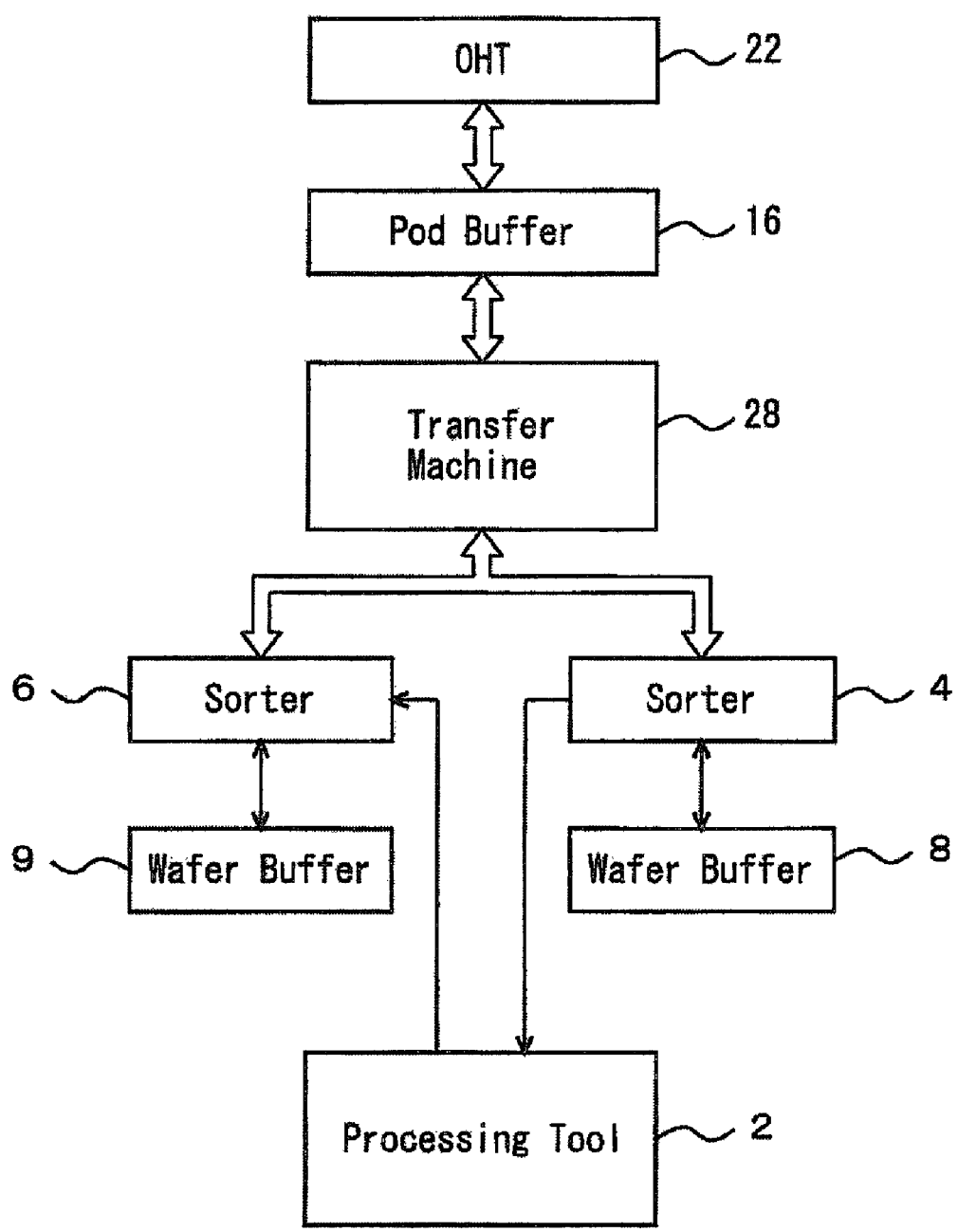

APPARATUS AND METHOD FOR SUPPLYING ARTICLES TO PROCESSING TOOL

TECHNICAL FIELD

The present invention relates to an apparatus for supplying articles such as semiconductor wafers to a processing tool.

BACKGROUND ART

The applicant proposed to provide an apparatus for placing a liquid crystal substrate, a plasma display substrate, or the like on a tray, and supplying it to a processing tool (Patent Publication 1: Japanese Laid-Open Patent Publication No. 2004-168483). The apparatus transports the tray using a conveyor, stores the tray in front of the processing tool, takes the substrate out of the tray, and supplies it to the processing tool.

In the case of supplying semiconductor wafers or the like to a processing tool, a plurality of the wafers are placed in one pod for transportation. If the wafers are not supplied to the processing tool timely, the efficiency of the processing tool becomes low. In particular, even if the number of wafers in the pod is different from the number of wafers processed at one time at the processing tool, it is necessary to supply the required number of wafers to the processing tool. In preparation for the case in which the order of arrival of pods is different from the order of priority in processing the wafers, a system for changing the order of supplying the wafers to the processing tool from the order of arrival of pods is required. Further, in some cases, the combination of wafers in the pod needs to be changed to match the next processing tool. Therefore, at the time of supplying the processed wafers to the pod, the system for changing combination of the wafers is required. In an attempt to solve the problem, the inventor conceived the present invention.

DISCLOSURE OF THE INVENTION

Problems to be Solved by the Invention

An object of the present invention is to make it possible to supply a number of articles required for a processing tool even if the number of articles processed by the processing tool is larger than the number of articles stored in a container.

Another object of the present invention is to make it possible to process the articles in the order of priority rather than the order of arrival of articles at the processing tool.

Still another object of the present invention is to make it possible to change combination of articles stored in a container to match the next processing tool.

Means for Solving the Problems

The present invention provides an apparatus for taking articles out of a container containing a plurality of articles, and supplying the articles to a processing tool. The apparatus includes:

a container storage rack for storing the container;

an article storage rack for storing the articles taken out of the container;

transfer means for placing the articles into, and taking the articles out of the container for transporting the articles between the container and the article storage rack;

transportation means for transporting the container between the transfer means and the container storage rack; and supply means for supplying required articles taken out of the article storage rack to the processing tool, and supplying the articles from the processing tool to the article storage rack.

Preferably, the supply means is capable of supplying the required article in the article storage rack at random positions to the processing tool.

Further, preferably, the transfer means is capable of storing the required articles in the article storage rack at random positions into the container.

In particular, preferably, the supply means and the transfer means are sorters capable of placing the articles in, and taking the articles out of the article storage rack at random positions.

Most preferably, the container storage rack includes an uppermost shelf for allowing the container to be transferred between the uppermost shelf and an overhead traveling vehicle other than the article supply apparatus, and a lower shelf for allowing the container to be transferred between the uppermost shelf and the lower shelf by the transportation means; and the transportation means includes a carriage, a mast provided at the carriage, and a SCARA arm or a slide fork elevated or lowered along the mast.

According to another aspect of the present invention, a method of supplying articles to a processing tool by transporting the articles between a container containing a plurality of articles and the processing tool for the articles is provided. The method comprises the steps of:

storing the container in a container storage rack;

transporting the container between the container storage rack and transfer means by transportation means;

placing the articles into, and taking the articles out of the container for transporting the articles between the container and the article storage rack by the transfer means; and supplying required articles taken out of the article storage rack to the processing tool, and supplying the articles from the processing tool to the article storage rack by supply means.

ADVANTAGES OF THE INVENTION

In the present invention, the container is stored temporarily in the storage rack, and the articles taken out of the container are stored in the article storage rack. Thus, it is possible to store the articles required for the processing tool in these racks, and rapidly supply the articles to the processing tool.

Further, the container storage rack can be used as a buffer for an external transportation apparatus. Therefore, the efficiency of transportation by the external transportation apparatus is increased. Further, by controlling the order in which the containers are taken out of the container storage rack, the order of arrival of containers and the order in processing the articles by the processing tool can be changed in units of containers.

In the case where the supply means is capable of supplying the required articles from the article storage rack to the processing tool randomly, it is possible to change the order of supplying the articles from the article storage rack to the processing tool, and process the articles in the order of priority.

Further, in the case where the transfer means can store the required articles taken out of the article storage rack in the container randomly, it is possible to change the combination of articles set in the container to match the next processing tool or the like.

BRIEF DESCRIPTION OF THE DRAWINGS

FIG. 1 is a plan view showing an article supply apparatus according to an embodiment.

FIG. 2 is a front view showing the article supply apparatus according to the embodiment.

[FIG. 3]

FIG. 3 is a diagram showing a route of supplying articles in the embodiment.

DESCRIPTION OF THE NUMERALS

Figure 1:
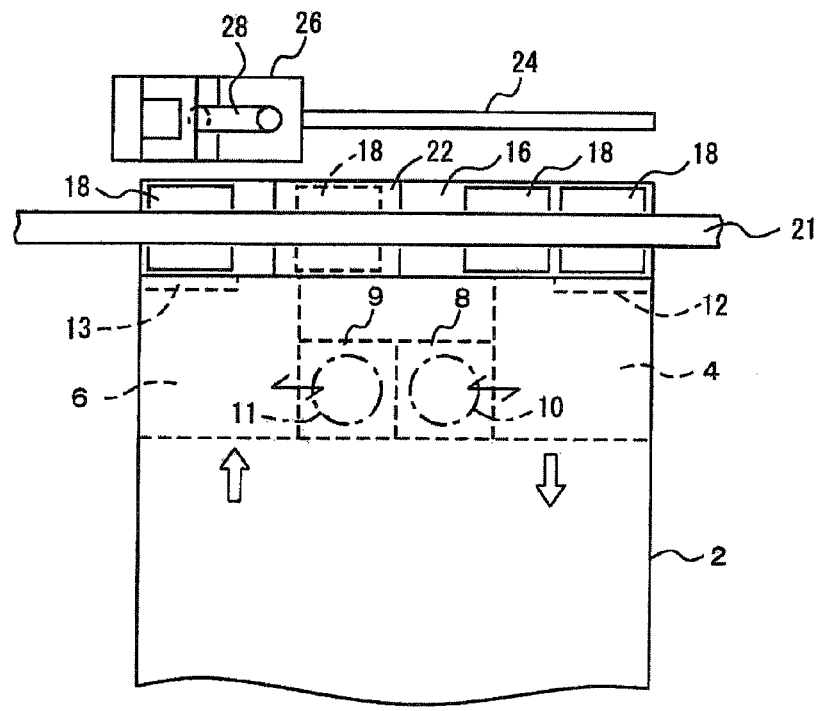
[FIG. 1]

2: processing tool
4, 6: sorter
8, 9: wafer buffer
10, 11: wafer
12, 13: entrance (exit)
14, 15: load port
16, 17: pod buffer
18: pod
21, 24: running rail
22: overhead traveling vehicle
26: carriage
28: transfer machine
29: mast

[Embodiment]

Figure 2:
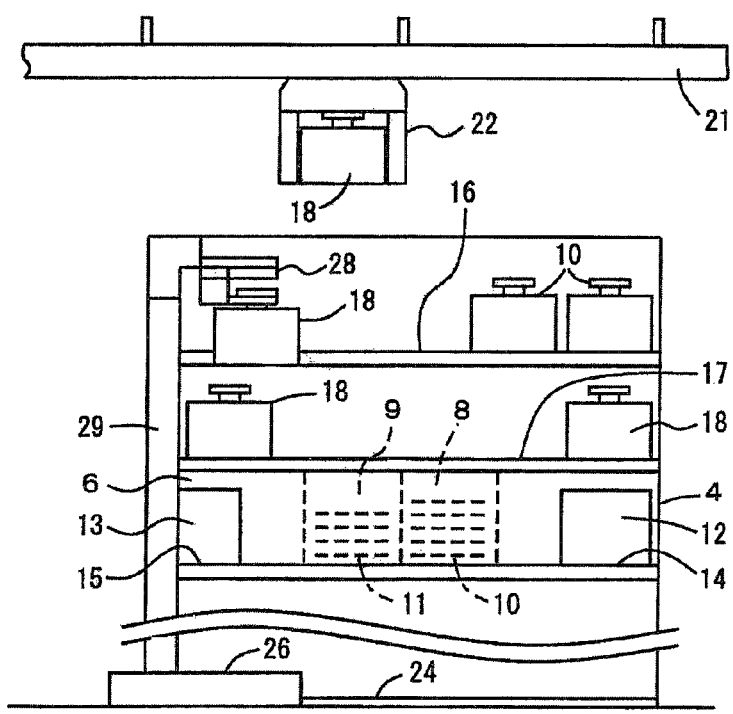
[FIG. 2]

FIGS. 1 to 3 show an embodiment in which transportation and supply of semiconductor wafers in a clean room are taken as an example. In the drawings, a reference numeral 2 denotes a processing tool, e.g., for processing and inspecting the semiconductor wafers. For example, a pair of sorters 4, 6 are provided in front of the processing tool 2. Each of pods 18 contains a plurality of semiconductor wafers. The semiconductor wafers are placed in, or taken out of the pod 18 one by one. The sorters 4, 6 are used as both of transfer means and supply means. Alternatively, the transfer means and the supply means may be different members. Reference numerals 8 and 9 denote wafer buffers for storing wafers taken out of the pod 18. The wafer buffer is an example of an article storage rack. At the sorter 4, the wafers are taken out of, or placed in the wafer buffer 8 one by one, at random positions. Likewise, at the sorter 6, the wafers are taken out of, or placed in the wafer buffer 9 one by one, at random positions. The plurality of semiconductor wafers stored in the wafer buffers 8, 9 are denoted by reference numerals 10, 11. Entrances (exits) 12, 13 each having a shutter (not shown) are provided between the sorters 4, 6 and load ports 14, 15. Further, pod buffers (container storage racks) 16, 17 are provided above, and under the load ports 14, 15 at overlapping positions in a plan view, for example.

A running rail 21 is provided at a position near a ceiling of the clean room. An overhead traveling vehicle 22 as transportation means between apparatuses travels along the running rail 21. The overhead traveling vehicle 22 passes the pod 18 to, and receives the pod 18 from an uppermost pod buffer 16 at the highest level. For example, a running rail 24 is provided on the floor, e.g., in front of the processing tool 2. Further, a carriage 26 having a transfer apparatus 28 is provided. For example, the transfer apparatus 28 includes a SCARA arm and a slide fork. The transfer apparatus 28 can be elevated, and lowered along a mast 29 of the carriage 26. The transfer apparatus 28 transfers the pod 18 between the uppermost pod buffer 16 and a lower the pod buffer 17 below the pod buffer 16, and between the pod buffers 16, 17 and the load ports 14, 15. The transfer apparatus 28 and the carriage 26 are used as transportation apparatus in the processing tool. Alternatively, the transfer apparatus 28 and the carriage 26 may be used commonly by a plurality of the processing tools. Likewise, the pod buffers 16, 17 may be used commonly by a plurality of the processing tools.

FIG. 3 shows a flow of articles in the embodiment. As the transportation means between the processing tools 2, the overhead traveling vehicle 22 is provided. The overhead traveling vehicle 22 passes the pod to, and receives the pod from the pod buffer 16. The transfer apparatus 28 can be elevated, and lowered at the carriage. The transfer apparatus 28 transfers the pod between the pod buffer 16, 17, and between the load ports 14, 15. Thus, when required by the sorters 4, 6, the pods can be transferred to the load ports 14, 15 by the transfer apparatus 28. Conveyors (not shown) are provided in the load ports 14, 15 for transporting the pods between the sorters 4, 6. At the sorter 4, the wafers are placed in, or taken out of the pod, and some of the wafers which are required immediately are directly supplied to the processing tool 2, and the other wafers are temporarily stored in the wafer buffer 8. The wafers required by the processing tool 2 are arbitrarily taken out of the wafer buffer 8 by the sorter 4, and the wafers are supplied to the processing tool 2. Alternatively, all of the wafers may be stored temporarily in the wafer buffer 8.

After the wafers are processed by the processing tool 2, the processed wafers are taken out of the processing tool 2 by the sorter 6, and temporarily stored in the wafer buffer 9. If there are any wafers which need to be transported immediately, the wafers are not stored in the wafer buffer 9, and stored in the pod by the sorter 6. The required wafers are randomly, i.e., selectively taken out of the wafer buffer 9, and stored in the pods. The pods containing the wafers are stored in the pod buffer 16, 17, and transported by the overhead traveling vehicle.

In the embodiment, the following advantages are obtained.

(1) It is possible to store the wafers required by the processing tool 2 in the wafer buffer 8. Further, the pod buffers 16, 17 are used as buffers for the pods between the overhead traveling vehicle 22 and the processing tool 2. The required wafers are selectively supplied to the processing tool 2. Thus, the required number of the wafers are always supplied to the processing tool 2. For example, even if the number of transported wafers in the pod 18 and the number of wafers required by the processing tool 2 are different, no trouble occurs.

(2) The order of wafers supplied to the processing tool 2 can be changed in two steps, i.e., the order of pods supplied from the pod buffers 16, 17 to the sorter 4, and the order of wafers supplied from the wafer buffer 8 or the like to the processing tool 2 by the sorter 4. Thus, in the case where the priority in processing the wafers varies depending on the wafers, the wafers can be processed in accordance with the priority.

(3) The wafers processed by the processing tool 2 are temporarily stored in the wafer buffer, and at the sorter 6, the required wafers are randomly taken out, and stored in the pod. Thus, in accordance with the needs of the processing tool in the next step, combination of wafers stored in the pod can be changed. Thus, even in the case of combination where the wafers are processed by a plurality of processing tools, and different processing tools are used in the course of processing the wafers, it is possible to store the wafers in the same pod, and transport the pod containing the wafers.

In the embodiment, as an example, the pod buffer 17 is provided at one level between the load ports 14, 15 and the pod buffer 16. Alternatively, further levels for placing the pod buffers may be provided below the load ports 14, 15. In the case where shortage occurs in the storage of the pod buffers 16, 17, an additional pod storage rack should be provided on a side opposite to the processing tool 2 in FIG. 1. Although the embodiment has been described in connection with the case in which, as the transportation apparatus between the pod buffers 16, 17 and the load ports 14, 15, the transfer apparatus 28 which is elevated or lowered is provided in the carriage 26 traveling on the rail 24, the type and structure of the transportation apparatus 28 may be adopted arbitrarily. In the case where shortage occurs in the processing capability of the sorters 4, 6, an additional sorter should be provided for placing the wafers into, or taking the wafers out of the wafer buffer 8, 9 randomly between the wafer buffers 8, 9, and the processing tool 2.

The invention claimed is:

1. A method of supplying articles to a processing tool by transporting the articles between containers containing articles and the processing tool for the articles, the method comprising the steps of:

storing the containers in a container storage rack;

transferring the containers between the container storage rack and a first sorter device and between the container storage rack and a second sorter device by a transfer device;

placing the articles into, and taking the articles out of the containers for transporting the articles between the container and a first article storage rack by the first sorter device;

taking the articles out of the containers, placing the articles in the first article storage rack, taking the articles out of the first article storage rack and placing the articles in the processing tool, and taking and placing the articles in and out of randomly selected positions in the first article storage rack by the first sorter device; and taking the articles out of the processing tool and placing the articles taken out of the processing tool in the second article storage rack, taking the articles out of the second article storage rack and placing the articles into the containers, and taking and placing the articles in and out of randomly selected positions in the second article storage rack by the second sorter device.

* * * * *